United States Patent
Döpping et al.

(10) Patent No.: US 8,123,866 B2
(45) Date of Patent: Feb. 28, 2012

(54) WAFER MANUFACTURING METHOD AND DEVICE

(75) Inventors: Jürgen Döpping, Freiberg (DE); Matthias Reinecke, Pesterwitz (DE); Holger Brosche, Dresden (DE); Hans-Joachim Gretzschel, Dresden (DE); Steffen Pollack, Dresden (DE)

(73) Assignee: Deutsche Solar GmbH, Freiberg (DE)

( * ) Notice: Subject to any disclaimer, the term of this patent is extended or adjusted under 35 U.S.C. 154(b) by 730 days.

(21) Appl. No.: 11/935,269

(22) Filed: Nov. 5, 2007

(65) Prior Publication Data
US 2008/0105247 A1  May 8, 2008

(30) Foreign Application Priority Data
Nov. 8, 2006 (DE) .......................... 10 2006 052 910

(51) Int. Cl.
*C03C 23/00* (2006.01)
*C23G 1/00* (2006.01)
(52) U.S. Cl. .............................. 134/2; 134/25.1; 216/83
(58) Field of Classification Search ............. 134/2, 25.1; 216/83, 99
See application file for complete search history.

(56) References Cited

U.S. PATENT DOCUMENTS

| | | | | | |
|---|---|---|---|---|---|
| 5,908,042 | A | * | 6/1999 | Fukunaga et al. | 134/25.1 |
| 5,922,137 | A | * | 7/1999 | Fukunaga et al. | 134/2 |
| 5,977,041 | A | * | 11/1999 | Honda | 510/175 |
| 6,006,736 | A | * | 12/1999 | Suzuki et al. | 125/13.02 |

FOREIGN PATENT DOCUMENTS

| | | |
|---|---|---|
| DE | 102 10 021 A1 | 8/2002 |
| DE | 102 10 024 A1 | 9/2002 |
| JP | 61111557 A * | 5/1986 |

OTHER PUBLICATIONS

German Examination Report 10 2006 052. 910.3-24 (3 pages total).

* cited by examiner

*Primary Examiner* — Roberts Culbert
(74) *Attorney, Agent, or Firm* — James B. Conte; Husch Blackwell LLP

(57) ABSTRACT

The invention relates to a device for manufacturing semiconductor material wafers with a sawing device for the sawing of slices attached to a saw holder, a pre-cleaning device arranged in the process direction downstream of the sawing device for pre-cleaning the surfaces of the slices hanging on the saw holder, and a degluing device arranged downstream in the process direction for detaching the slices from the saw holder.

8 Claims, 4 Drawing Sheets

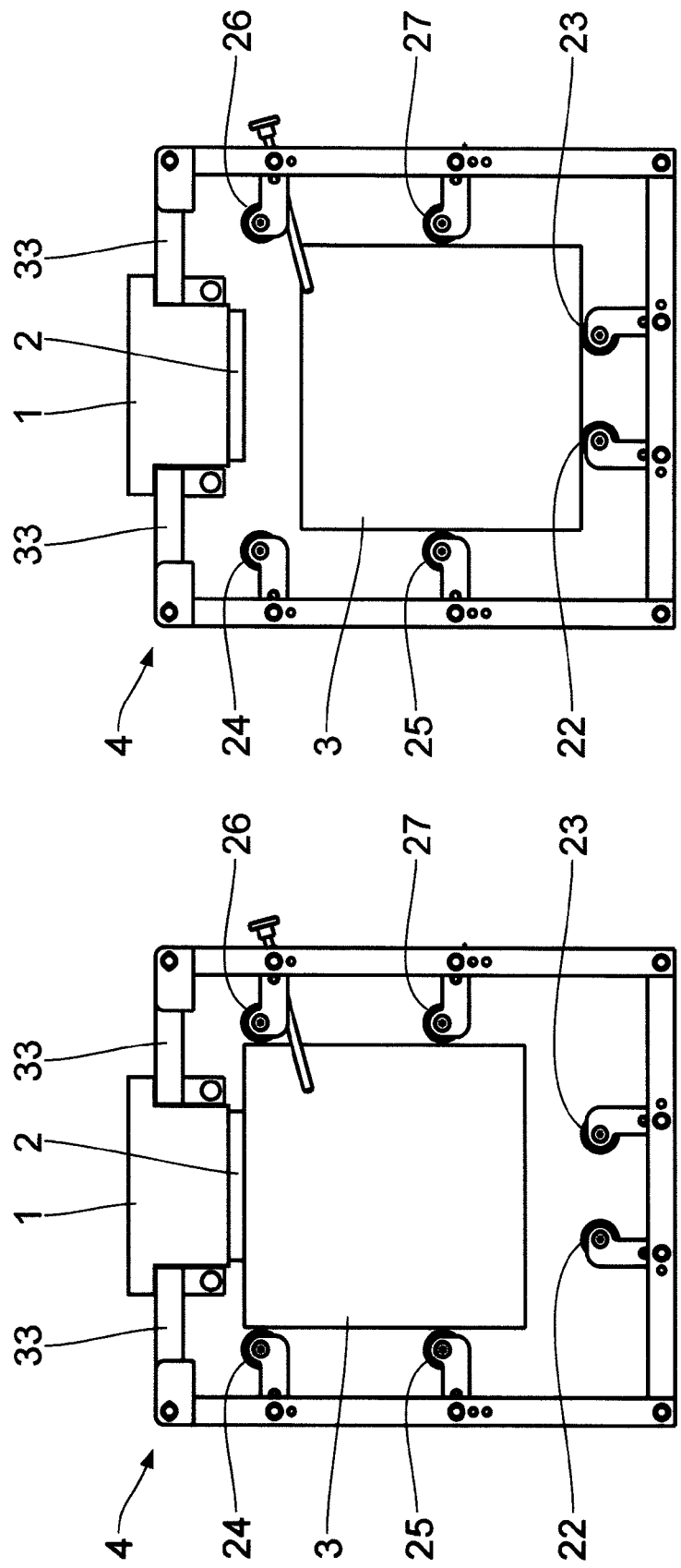

WAFER MANUFACTURING METHOD AND DEVICE

BACKGROUND OF THE INVENTION

Field of the Invention

The invention relates to a device and a method for manufacturing wafers from semiconductor material, especially silicon.

During the manufacture of wafers, silicon blocks are glued to a saw holder. Thereafter, the silicon block is sawn into individual slices, which still adhere to the holder after the sawing process. Subsequent thereto, the slices are detached from the holder and they then run through various cleaning steps. This is very labour-intensive because the rearranging of the slices after the sawing process into new holders requires a lot of work.

SUMMARY OF THE INVENTION

The invention is based on the object of creating a device and a method with which wafers can be manufactured more easily.

Said object is on the one hand achieved by a device for manufacturing semiconductor wafers comprising a sawing device for the sawing of slices attached to a saw holder, a pre-cleaning device arranged downstream of the sawing device in the process direction for pre-cleaning the surfaces of the slices hanging on the saw holder and a degluing device arranged down-stream in the process direction for detaching the slices from saw holder. On the other hand, said object is also achieved by a method for manufacturing semiconductor wafers comprising the following steps: sawing of slices attached to a saw holder, pre-cleaning of the slices attached to the saw holder, removing of the slices from the saw holder and catching of the slices in a catching device, and further processing of the separated slices. The core of the invention consists in leaving the slices on the saw holder after the sawing and performing the first cleaning steps whilst the slices are still attached to the saw holder. Only thereafter are the slices detached from the saw holder.

Additional features and details of the invention result from the description of an embodiment based on the drawings.

BRIEF DESCRIPTION OF THE DRAWINGS

FIG. 3 shows a side view of the catching device according to FIG. 2, with the silicon slices being attached to the saw holder, FIG. 4 shows a side view according to FIG. 3, with the silicon slices being detached from the saw holder.

DESCRIPTION OF THE PREFERRED EMBODIMENT

Figure 1:
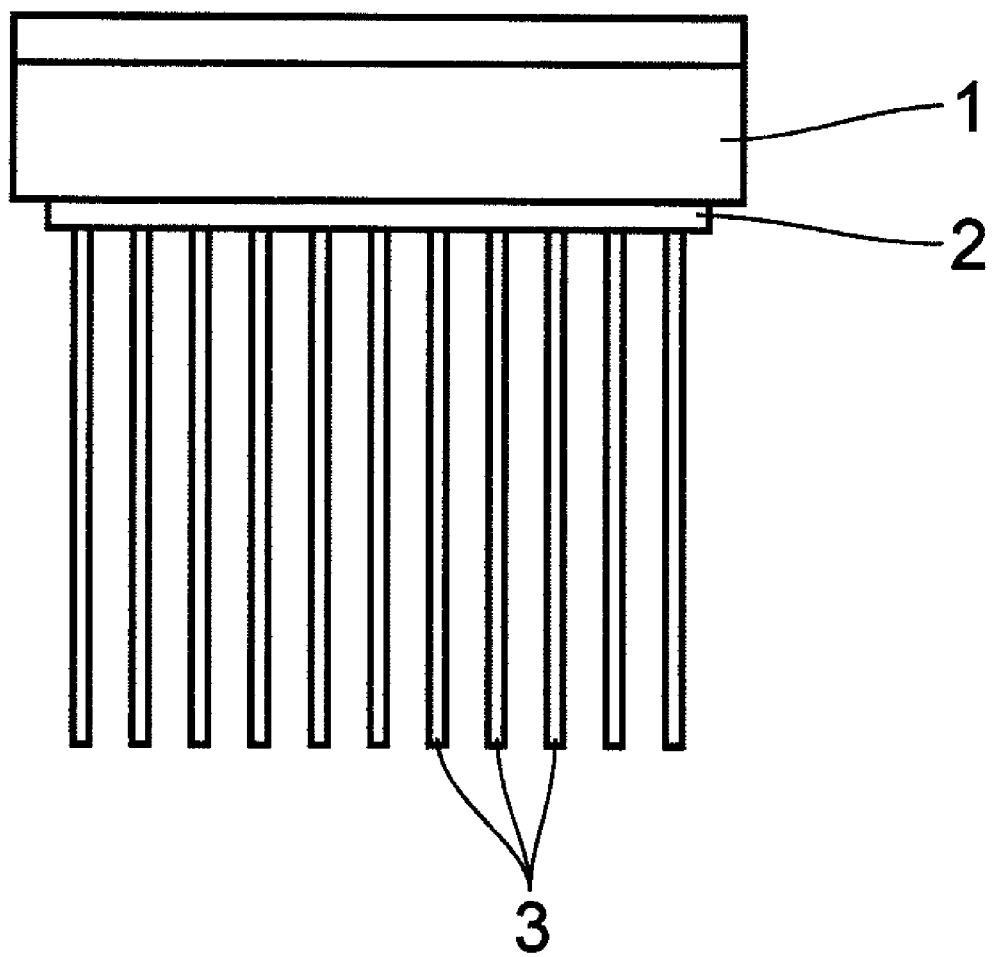
FIG. 1 shows a saw holder with silicon slices.

For the manufacture of wafers, especially from silicon, silicon blocks are first sawn into columns, which, in their cross-section, almost have the shape of the wafers to be manufactured. Generally they can be blocks of any material, especially of any semiconducting material, preferably of silicon. The blocks can be monocrystalline or polycrystalline material, especially silicon. The wafers are especially envisaged for use in photovoltaics. The columns exhibit a dimension (length x width x height) of e.g. 500×100×100 mm up to 900×400×400 mm. On a longitudinal surface, the columns are glued, via a glue layer 2, to a saw holder 1 consisting, for example, of glass. Thereafter, the columns are sawn by a commercially available wire saw into slices 3. The slices 3 exhibit a thickness of 100 µm to 400 µm. In accordance with the aforementioned cross-section of the columns, the slices 3 have a surface of 100 mm ×100 mm to 400 mm×400 mm. In FIG. 1 the slices 3 are shown schematically after the completed sawing process, said slices still hanging on the saw holder 1. Neither the thickness of the slices nor their distance from one another are according to scale.

Figure 2:
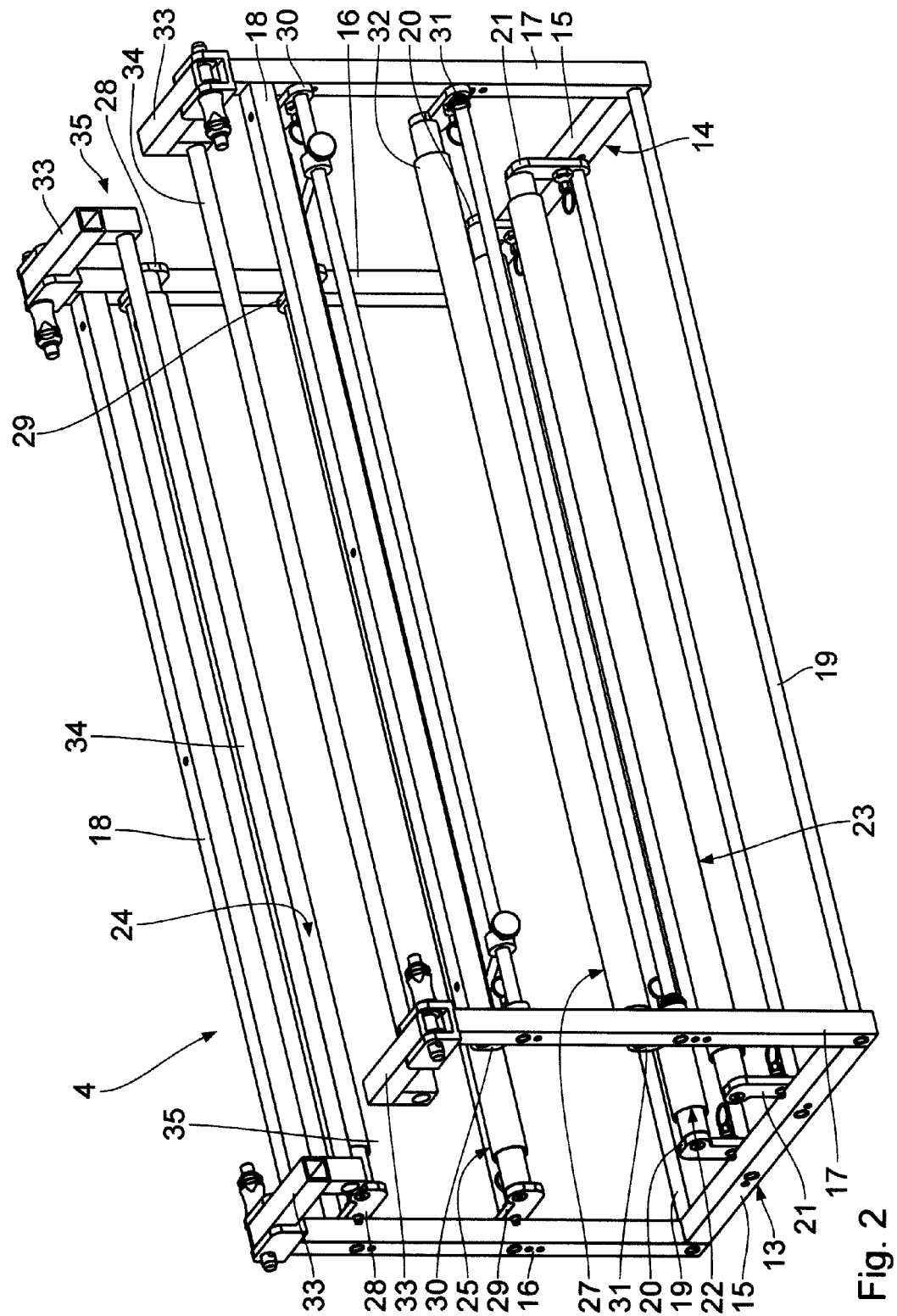
FIG. 2 shows a catching device for silicon slices.
Figure 5:
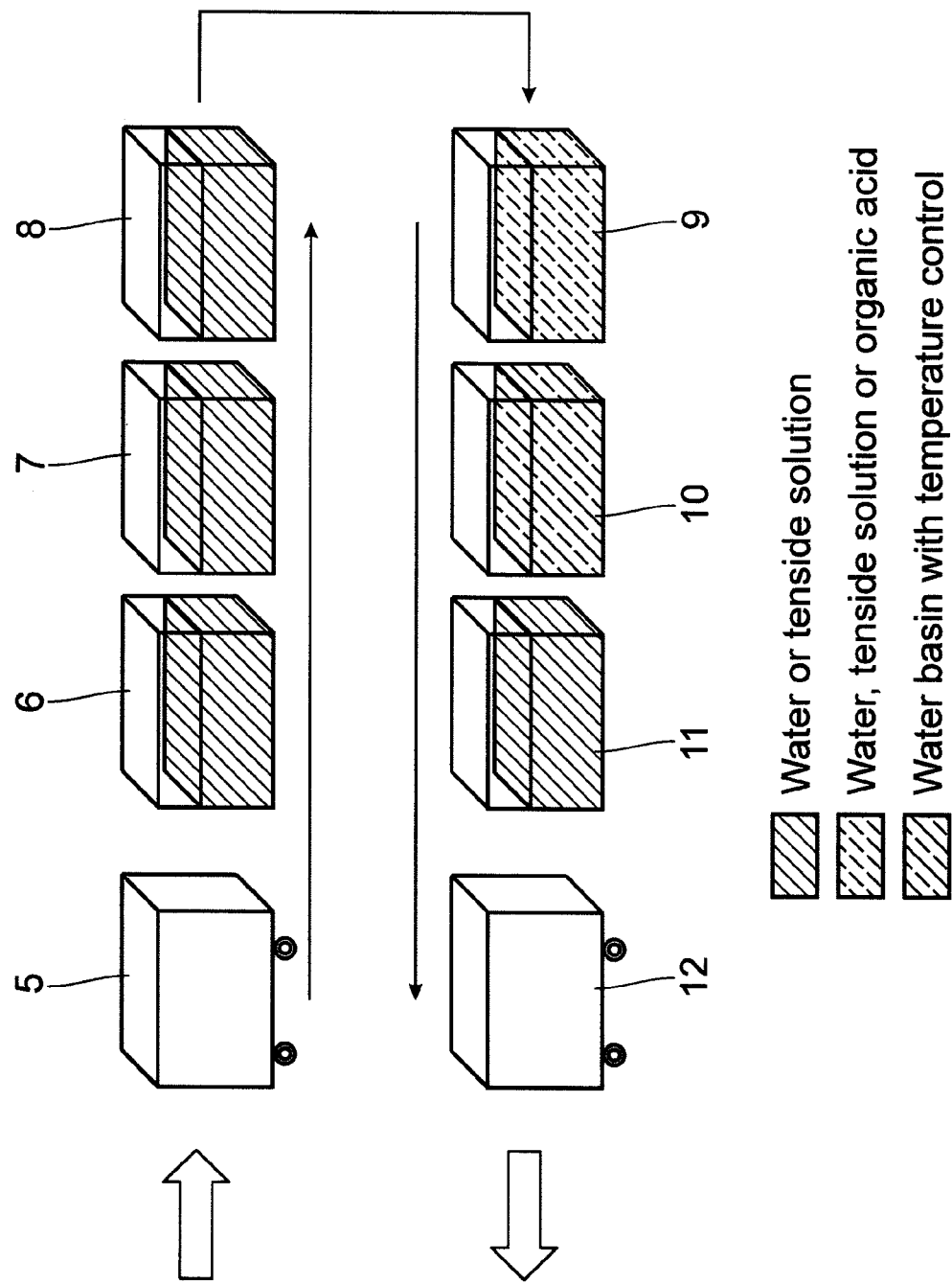
FIG. 5 shows a flow chart for the cleaning of the silicon slices.

After the end of the sawing process, the saw holder 1, together with the slices 3, is removed from the sawing device. Thereafter, the saw holder 1, together with the slices 3 attached thereto, is equipped with a catching device 4 as shown in FIG. 2. The catching device 4 serves to stabilise the slices 3 during the further process steps and the subsequent catching of the slices 3 after they have been removed from the saw holder 1.

Afterwards, the slices 3 hanging on the saw holder 1 are transferred together with the catching device 4 into a loading wagon 5, which exhibits a basin filled with a liquid to accommodate the slices 3. In the loading wagon 5 the slices are conveyed to a buffer basin 6. The buffer basin 6 is filled with a liquid, especially water or a tenside solution, and serves the interim storage of the slices 3.

Thereafter, the slices 3 are conveyed to a pre-cleaning basin 7 in which there takes place the removal of the cutting slurry or the cutting sludge by spraying thereon a cleaning liquid, which can, for example, be water with or without added tenside or an organic substance. The pre-cleaning with water or an aqueous tenside solution takes place at 10° C. to 45° C., especially 20° C. to 35° C. The removal of the cutting slurry takes place above and/or below the liquid level and by lifting out, from the liquid-filled basin, once or several times, the slices 3 adhering to the saw holder 1. These procedures are repeated until a satisfactory cleaning result is achieved. Thereafter, the slices 3 are conveyed to a second buffer basin 8, which is filled with a corresponding liquid—same as basin 6.

Then follows a transfer into a second process basin, namely the degluing basin 9, which is filled with a degluing solution. The degluing takes place at 60 to 100° C., especially 70 to 95° C. The degluing solution consists, for example, of water with or without added tenside or a mixture of water with an organic acid. Until they reach the degluing basin 9, the slices 3 are firmly connected, via the glue layer 2, to the original saw holder 1. In the degluing basin 9 the slices 3 are detached from the saw holder 1. In order to facilitate the dismantling process, the wire-sawn columns introduced into the catching device 4 can be tilted along their longitudinal axis by an angle of between 0° and 45° against the horizontal. The end of the dismantling process is characterised by the complete detaching of all slices 3 from the saw holder 1. Subsequent thereto, the degluing solution is removed from the degluing basin 9, and a surface drying of the slices 3, which have been heated to a temperature of 70 to 90° C., is prevented by spraying with warmed solution. After the detaching of the slices 3 from the saw holder 1 they are caught in the catching device 4. Thereafter, the catching device 4, inclusive of the separated slices 3, is transferred into a cooling basin 10, which exhibits a temperature of 40 to 60° C. The cooling basin 10 contains an appropriate solution.

After cooling down in the cooling basin 10, the slices 3 in the catching device 4 are transferred into another buffer basin 11, which is liquid-filled. From there, the slices 3 in the catching device 4 are transferred into a liquid-filled unloading wagon 12, with which the slices 3 are conveyed to a singling device. At the end of the process there emerge cleaned, high-quality, singularised wafers made of a semiconductor material, especially silicon.

The advantage of the invention is that the removal of the cutting slurry and the pre-cleaning take place whilst the slices 3 are still hanging on the saw holder 1. This has the central advantage that the slices 3 with the cutting slurry on the surface do not have to be singularised for the removal thereof. Especially for small slice thicknesses of e.g. 100 µm, this can lead to damage to the slices. According to the present invention, the singling of the slices occurs only when they have been pre-cleaned.

In the following, the catching device 4 will be described in more detail with reference to FIGS. 2 to 4. The catching device 4 essentially exhibits the shape of a cube in a lattice shape. The front sides are formed by U-shaped front parts 13, 14 each consisting of a base strut 15 and two legs 16, 17 extending upwardly therefrom. The front parts 13, 14, which face one another, are connected with each other by upper longitudinal carriers 18 and lower longitudinal carriers 19, so that there emerges a rigid cubic trestle. In the area of the base struts 15 of both the front part 13 and the front part 14 there are arranged two swingable arms 20, 21 between which there are arranged rotatably disposed rollers 22, 23. The arms 20, 21 are lockable in the upwardly swung position shown in FIG. 2. Between the two legs 16 on the one side, and the two legs 17 on the other side, there are arranged in each case above one another two rollers 24, 25 on the one side and 26, 27 on the other side, which are carried by corresponding arms 28 and 29, and 30 and 31, respectively, which are swingably attached to the legs 16 and 17, respectively. All rollers 22 to 27 are provided, on their surface, with a plastic or rubber hose 32, which exhibits circumferential grooves in a large number, which are to hold the silicon slices 3 in a vertical position. At the top end of the legs 16 and 17 there is articulated in each case a carrier arm 33, whereby there are connected, by a bar 34, carrier arms 33 facing one another in the longitudinal direction. Between opposing carrier arms 33 swung into the horizontal there remains an accommodating gap 35.

After the end of the sawing process the saw holder 1, together with the slices 3, is hung into the catching device 4, the saw holder 1 being arranged in the gap 35 and supported vis-a-vis the carrier arms 33. The silicon slices 3 are fixed crosswise between the rollers 24 to 27, the soft hose 32 preventing damage to the slices 3 by contacting. After the removal of the glue layer 2, the slices 3 slide vertically downwards, as shown in FIG. 4, until they are held by the rollers 22 and 23.

What is claimed is:

1. A method for manufacturing semiconductor wafers comprising the following steps:
    sawing of columns attached to a saw holder (1) into slices (3), wherein the slices have a longitudinal axis coinciding with a longitudinal axis of the columns,
    pre-cleaning of the slices (3) attached to the saw holder (1) and in,
    removing of the slices (3) from the saw holder (1) and catching of the slices (3) in a catching device (4), and
    further processing of the separated slices (3),
    wherein the slices introduced into said catching device are tilted along their longitudinal axis against the horizontal while still on the saw holder (1) and while equipped with the catching device.

2. A method according to claim 1, wherein the slices (3) connected to the saw holder (1) are transported from the sawing to the pre-cleaning in a wagon.

3. A method according to claim 2, wherein the pre-cleaning is carried out with water or an aqueous tenside solution at 10 to 45° C.

4. A method according to claim 3, wherein the removal of the slices (3) from the saw holder (1) is carried out with at least one of water and an aqueous tenside solution and an aqueous solution of an organic acid at 60 to 100° C.

5. A method according to claim 4, wherein the removal of the slices (3) from the saw holder (1) is carried out with at least one of water and an aqueous tenside solution and an aqueous solution of an organic acid at 70 to 95° C.

6. A method according to claim 3, wherein the pre-cleaning is carried out with water or an aqueous tenside solution at 20 to 35° C.

7. A method according to claim 6, wherein after the removal from the saw holder (1) the singularised slices (3) are cooled down, especially cooled down to a temperature of 40 to 60° C.

8. A method according to claim 7, wherein, after the cooling down, the separated slices (3) are conveyed in a wagon to the further processing.

* * * * *